United States Patent
Birkbeck

(10) Patent No.: US 10,211,801 B2
(45) Date of Patent: Feb. 19, 2019

(54) HYBRID COUPLER WITH PHASE AND ATTENUATION CONTROL

(71) Applicant: pSemi Corporation, San Diego, CA (US)

(72) Inventor: John Birkbeck, New Milton (GB)

(73) Assignee: pSemi Corporation, San Diego, CA (US)

(*) Notice: Subject to any disclaimer, the term of this patent is extended or adjusted under 35 U.S.C. 154(b) by 27 days.

(21) Appl. No.: 15/212,046

(22) Filed: Jul. 15, 2016

(65) Prior Publication Data

US 2018/0019722 A1    Jan. 18, 2018

(51) Int. Cl.
| | | |
|---|---|---|
| H01P 1/22 | (2006.01) | |
| H01P 1/18 | (2006.01) | |
| H03H 7/19 | (2006.01) | |
| H03H 7/20 | (2006.01) | |
| H03H 11/20 | (2006.01) | |
| H03H 7/25 | (2006.01) | |
| H01P 5/22 | (2006.01) | |

(52) U.S. Cl.
CPC ............ *H03H 7/19* (2013.01); *H03H 7/20* (2013.01); *H03H 7/25* (2013.01); *H03H 11/20* (2013.01)

(58) Field of Classification Search
CPC ............ H01P 1/22; H01P 5/18; H03H 7/48
USPC ..................... 333/81 R, 112, 116
See application file for complete search history.

(56) References Cited

U.S. PATENT DOCUMENTS

| | | | | |
|---|---|---|---|---|
| 4,902,983 A | * | 2/1990 | Fujiki | H03F 1/3252 330/149 |
| 5,109,204 A | * | 4/1992 | Keefer | H01P 1/22 333/116 |
| 5,281,928 A | | 1/1994 | Ravid et al. | |

(Continued)

FOREIGN PATENT DOCUMENTS

| | | |
|---|---|---|
| FR | 2678435 | 6/1991 |
| WO | 1993000719 | 1/1993 |

(Continued)

OTHER PUBLICATIONS

Vergoosen, Joannes, International Search Report and Written Opinion received from the EPO dated Aug. 21, 2017 for appln. No. PCT/US2017/032283, 11 pgs.

(Continued)

*Primary Examiner* — Dean Takaoka
(74) *Attorney, Agent, or Firm* — Jaquez Land Greenhaus LLP; Martin J. Jaquez, Esq.; John Land, Esq.

(57) ABSTRACT

An RF hybrid coupler with phase and attenuation control that efficiently combines the functions of phase shifting and attenuation within a circuit. Embodiments include a hybrid coupler connected to parallel resistance-reactance (RX) circuits, where the reactance X may be a capacitor C or an inductor L; a hybrid coupler connected to parallel RX circuits (which may be variable), each of which is in turn series coupled to an inductive element L which corrects for attenuation range collapse while providing for fairly flat phase shift and attenuation performance as a function of frequency; and two hybrid couplers in a combined phase shifter and attenuator configuration, each with opposite frequency-dependent slopes and cascaded in series such that the slopes substantially cancel each other out, resulting in flat responses versus frequency.

59 Claims, 10 Drawing Sheets

(56) References Cited

U.S. PATENT DOCUMENTS

| | | | | |
|---|---|---|---|---|
| 5,349,312 | A | * | 9/1994 | Huettner ............... H01P 1/227 333/109 |
| 5,477,200 | A | * | 12/1995 | Ono ....................... H01P 1/22 333/81 A |
| 5,568,105 | A | * | 10/1996 | O'Leary ................ G01S 7/023 327/540 |
| 5,666,089 | A | | 9/1997 | Ehlers |
| 5,811,961 | A | * | 9/1998 | Daughters ......... G01R 33/3621 323/213 |
| 6,326,843 | B1 | * | 12/2001 | Nygren ................ H03F 1/3241 330/110 |
| 6,727,767 | B2 | * | 4/2004 | Takada .................. H03B 5/326 310/313 R |
| 6,876,271 | B2 | | 4/2005 | Evers et al. |
| 7,420,416 | B2 | * | 9/2008 | Persson ............... H03F 1/3276 330/149 |
| 7,839,233 | B2 | | 11/2010 | Zhao et al. |
| 9,467,118 | B2 | | 10/2016 | Zhou |
| 9,537,468 | B2 | | 1/2017 | Zhou |
| 2014/0049312 | A1 | | 2/2014 | Chih-Sheng |
| 2018/0019721 | A1 | | 1/2018 | Sharma |

FOREIGN PATENT DOCUMENTS

| | | |
|---|---|---|
| WO | 9300719 | 4/2016 |
| WO | 2018013207 | 1/2018 |

OTHER PUBLICATIONS

Lee, et al., "A Compact Attenuator Integrated Phase Shifter with Switchable Trimode Operations", Microwave and Optical Technology Letters, vol. 56, No. 8, Aug. 2014, pp. 1798-1800.

Luu, An T., Office Action received from the USPTO dated Jan. 19, 2018 for U.S. Appl. No. 15/212,025, 16 pgs.

De La Pinta, Luis, Written Opinion received from the EPO dated Jun. 19, 2018 for appln. No. PCT/US2017/032283, 6 pgs.

Luu, An T., Office Action received from the USPTO dated Aug. 1, 2018 for U.S. Appl. No. 15/212,025, 10 pgs.

Luu, An T., Final Office Action received from the USPTO dated May 7, 2018 for U.S. Appl. No. 15/212,025, 11 pgs.

De La Pinta, Luis, International Preliminary Report on Patentability received from the EPO dated Oct. 22, 2018 for appln. No. PCT/US2017/032283, 9 pgs.

\* cited by examiner

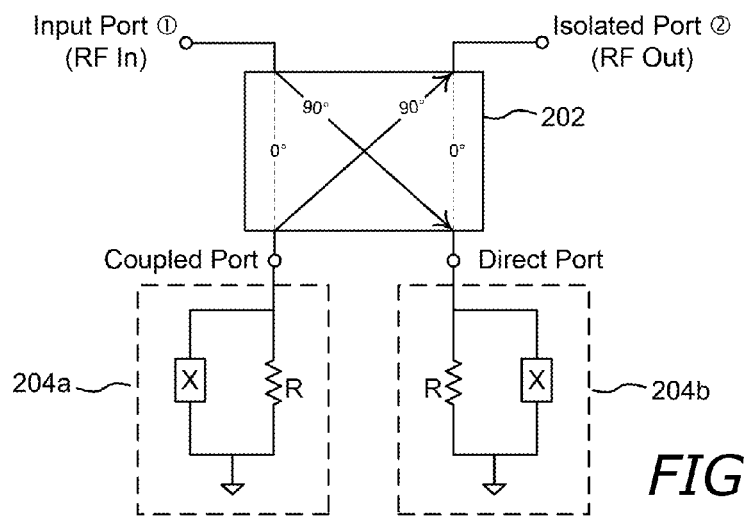
FIG. 2
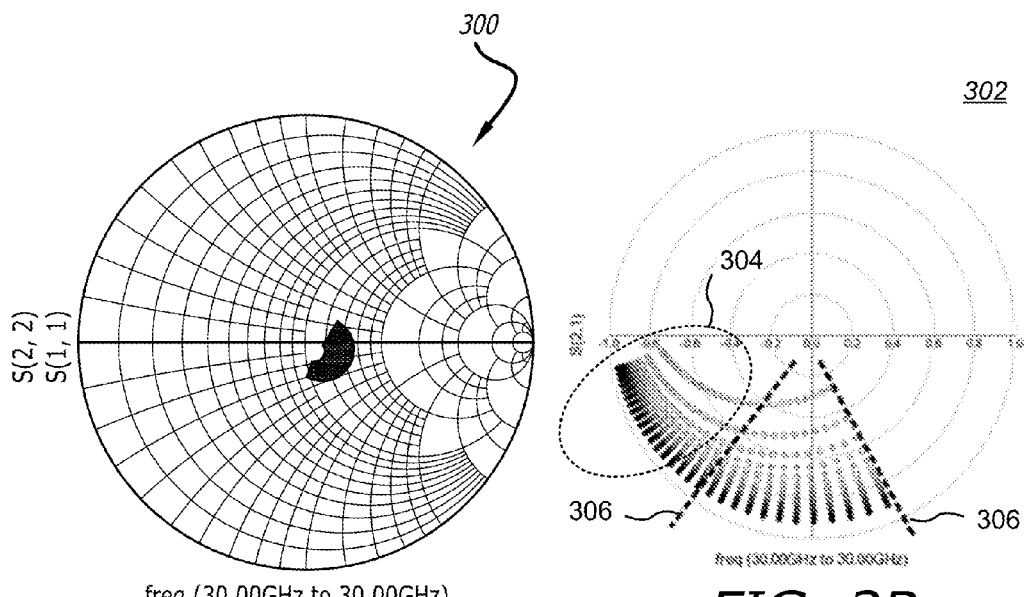
FIG. 3A
FIG. 3B

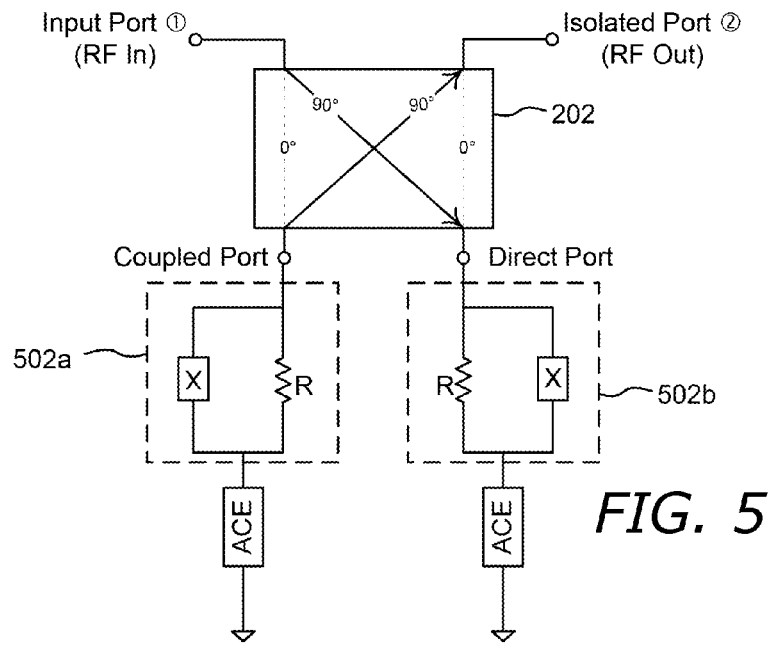
FIG. 5
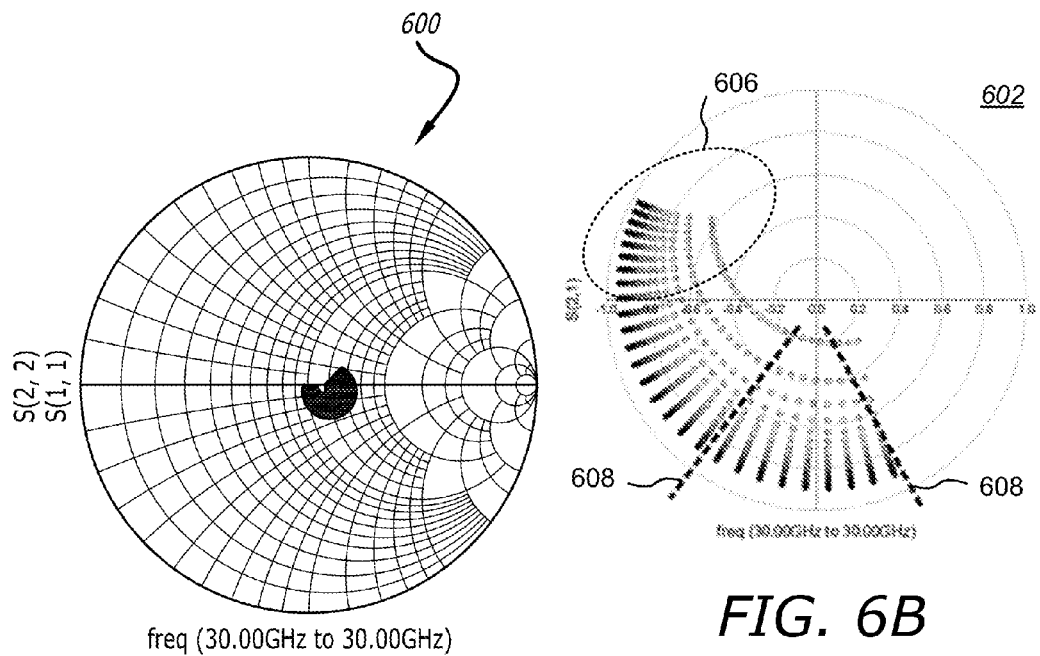
FIG. 6A
FIG. 6B

HYBRID COUPLER WITH PHASE AND ATTENUATION CONTROL

CROSS REFERENCE TO RELATED APPLICATIONS

The present application may be related to U.S. patent application Ser. No. 15/212,025, filed on even date, entitled "Attenuator De-Qing Loss Improvement and Phase Balance" and assigned to the assignee of the present disclosure, the contents of which are hereby incorporated by reference in their entirety.

BACKGROUND

(1) Technical Field

This invention relates to electronic circuits, and more particularly to electronic circuits for phase and attenuation control of radio frequency (RF) signals.

(2) Background

It is often necessary to change the phase and/or attenuation of RF signals for applications such as beam-forming networks, phase array antennas, power dividers, linearization of power amplifiers, and in-phase discriminators, to name a few. Hybrid couplers may be used in conjunction with a pair of terminating circuits as a phase shifter circuit or as an attenuator circuit.

A hybrid coupler is a passive device often used in radio and telecommunications, and is a type of directional coupler where the input power is equally divided between two output ports by electromagnetic coupling; accordingly, a hybrid coupler is often referred to as a 3 dB coupler. Hybrid couplers are also called quadrature couplers, and include Lange couplers (conventional and folded), branch line couplers, overlay couplers, edge couplers, and short-slot hybrid couplers, as well as other designs. As is known in the art, directional couplers have four ports. An Input Port is where power is applied (e.g., an RF signal). The Coupled Port is where a electromagnetically coupled portion of the power applied to the Input Port appears. The Direct Port is where the power from the Input Port is nominally output, less the portion of the power that went to the Coupled Port. Directional couplers are generally symmetrical, so there also exists a fourth port, the Isolated Port, which is isolated from the Input Port, but which may provide a useful output signal in particular applications.

FIG. 1A is a schematic diagram 100 of a hybrid coupler 102 in a phase shifter configuration. More particularly, a pair of capacitors 104a, 104b are respectively connected to the Coupled Port and the Direct Port of the hybrid coupler 102 to form a phase shifter circuit. Similarly, FIG. 1B is a schematic diagram 110 of a hybrid coupler 102 in an attenuator configuration. More specifically, a pair of resistors 106a, 106b are respectively connected to the Coupled Port and the Direct Port of the hybrid coupler 102 to form an attenuator circuit. In both cases, an RF signal introduced at the Input Port (RF In) is reflected back from the Coupled Port and the Direct Port into the hybrid coupler 102 in modified form (phase shifted or attenuated, respectively), and then exits out of the Isolated Port (RF Out).

In many applications, it is often useful to have multiple hybrid coupler-based RF phase shifter circuits and attenuator circuits on the same die. In fabricating increasingly complex integrated circuits (ICs) for RF applications, it is economically important to fit all needed circuitry on a minimum size IC die (or "chip"). Practical implementations of hybrid couplers for a particularly frequency range (e.g., 24-32 GHz) can constitute a substantial fraction of available layout space on an IC die. Accordingly, it would be useful to save IC layout space by combining the functions of phase shifting and attenuation within a single hybrid coupler-based RF circuit. The challenges in doing so include producing a sufficiently useful control range in both phase and attenuation with minimum interaction between both; achieving a flat performance over a broad frequency range; and achieving a layout topology which is suitable for IC fabrication, particularly when using a silicon-on-insulator (SOI) fabrication technology. The present invention meets these needs.

SUMMARY OF THE INVENTION

The present invention efficiently combines the functions of phase shifting and attenuation within a single hybrid coupler-based RF circuit. Embodiments of the invention provide a sufficiently useful control range in both phase and attenuation with minimum interaction between both; achieve a flat performance over a broad frequency range; and achieve a layout topology which is suitable for integrated circuit (IC) fabrication, particularly when using a silicon-on-insulator (SOI) fabrication technology.

In a first embodiment, a hybrid coupler has its termination ports coupled to corresponding parallel resistance-reactance (RX) circuits. In the simplest form, each parallel resistance-reactance circuit comprises a resistor R coupled in parallel with a reactance X, both of which are coupled to RF ground. The reactance X may be a capacitor or an inductor.

In a second embodiment, a hybrid coupler has its termination ports coupled to parallel RX circuits, each of which is in turn series coupled to a corresponding attenuation compensation element (ACE), which for parallel RC circuits, is an inductive element L or transmission line, and which for parallel RL circuits, is a capacitive element C. The ACE corrects for attenuation range collapse while providing for fairly flat phase shift and attenuation performance as a function of frequency.

In a third embodiment, a hybrid coupler has its termination ports coupled to variable parallel RX circuits, each of which is in turn series coupled to a corresponding ACE which corrects for attenuation range collapse while providing for fairly flat phase shift and attenuation performance as a function of frequency.

In a fourth embodiment, two hybrid couplers in a combined phase shifter and attenuator configuration, each with opposite frequency-dependent slopes, are cascaded. Accordingly, the slopes substantially cancel each other out, resulting in flat responses versus frequency. Such a cascaded circuit also would have approximately the sum of the phase shift and attenuation range of the individual circuits (typically approaching twice that of a single circuit) but with the benefit of flatter performance with frequency.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 2 is a schematic diagram of a first embodiment of a hybrid coupler in a combined phase shifter and attenuator configuration.

FIG. 3A is a Smith chart of the response of a model of the circuit shown in FIG. 2.

FIG. 3B is a polar plot of the S(2,1) response of a model of the circuit shown in FIG. 2.

FIG. 5 is a schematic diagram of a second embodiment of a hybrid coupler in a combined phase shifter and attenuator configuration.

FIG. 6A is a Smith chart of the response of a model of the circuit shown in FIG. 5.

FIG. 6B is a polar plot of the S(2,1) response of a model of the circuit shown in FIG. 5.

Like reference numbers and designations in the various drawings indicate like elements.

DETAILED DESCRIPTION OF THE INVENTION

Figure 1A:
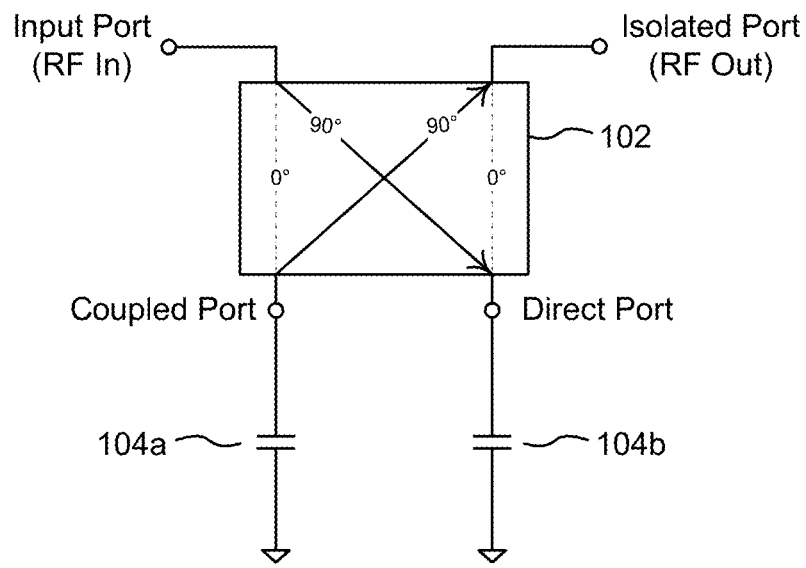
FIG. 1A is a schematic diagram of a hybrid coupler in a phase shifter configuration.
Figure 1B:
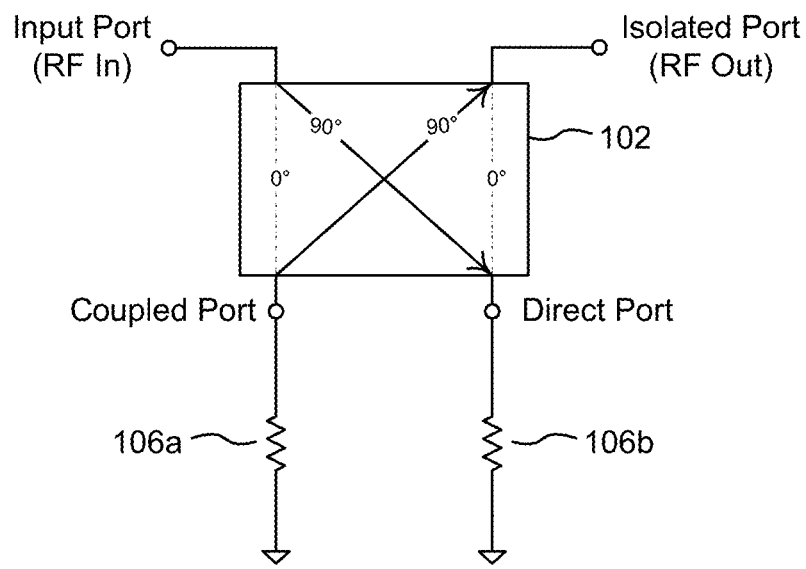
FIG. 1B is a schematic diagram of a hybrid coupler in an attenuator configuration.

The present invention efficiently combines the functions of phase shifting and attenuation within a single hybrid coupler-based RF circuit. Embodiments of the invention provide a sufficiently useful control range in both phase and attenuation with minimum interaction between both; achieve a flat performance over a broad frequency range; and achieve a layout topology which is suitable for integrated circuit (IC) fabrication, particularly when using a silicon-on-insulator (SOI) fabrication technology.

First Embodiment

FIG. 2 is a schematic diagram 200 of a first embodiment of a hybrid coupler 202 in a combined phase shifter and attenuator configuration. The hybrid coupler 202 may be of any of the types described above, but a Lange coupler (conventional or folded) is particularly useful in an IC implementation. The hybrid coupler 202 has its Coupled Port and its Direct Port—also referred to below as "termination ports"—coupled to parallel resistance-reactance (RX) circuits 204a, 204b. In the simplest form, each parallel RX circuit 204a, 204b comprises a resistor R coupled in parallel with a reactance X, both of which are coupled to RF ground. Note that "RF ground" in the context of the invention refers to a ground connection suitable for RF circuitry, rather than to "digital" ground typically used for DC and/or low frequency digital circuits and/or as an electro-static discharge (ESD) return path.

In many applications, it is particularly useful to utilize a capacitor as the reactance X, and thus each simple-form parallel RX circuit 204a, 204b would be a parallel RC circuit. In other applications, it may be useful to utilize an inductor as the reactance X, and thus each simple-form parallel RX circuit 204a, 204b would be a parallel RL circuit.

In alternative embodiments, the parallel RX circuits 204a, 204b may be more complex parallel RC, RL, and/or RLC circuits. For example, one or more of the components may be variable in value so as to provide for selectable value states. Thus, the resistor R may be a fixed-resistance component, or a variable resistance transistor, or a set of parallel fixed-resistances each in series with a corresponding switch element (e.g., a field effect transistor, or FET) so that one or more of the individual resistances may be switched into circuit (e.g., under digital control). Similarly, the reactance X may be a fixed-value or variable-value capacitor or inductor, or a network of fixed-value capacitors and/or inductors connected to one or more switch elements so that one or more of the individual capacitors and/or inductors may be switched into circuit. In some implementations, a variable capacitor may be a variable capacitance diode (varactor).

As mentioned above, in other embodiments, the parallel RX circuits 204a, 204b may be embodied as parallel RLC circuits. For example, a parallel inductive element L (see FIG. 8B) may be coupled in parallel with a variable R and a variable C. The added parallel inductive element L—generally fixed in value—may provide a further degree of freedom in adjustment and could potentially make the range of C values needed more practical. Thus, rather than needing a very small starting C value to get close to the open circuit point, a parallel L value could be introduced which is almost resonant with a larger and more practical C value to achieve the same effect. Similarly, the parallel RLC circuit may be implemented as a parallel capacitive element C coupled in parallel with a variable R and a variable L. Further, the parallel RLC circuit may be implemented with a variable resistance element R, a variable capacitance element C, and a variable inductive element L.

As should be apparent, other combinations of RC, RL, and/or RLC circuits may be used for the parallel RX circuits 204a, 204b to achieve desired design parameters. For example, in one embodiment, the reactance X in the parallel RX circuit 204a may be a capacitance element C while the reactance X in the parallel RX circuit 204b may be an inductive element L. Further, the values of the component R, C, and L elements need not be the same for each of the parallel RX circuits 204a, 204b.

FIG. 3A is a Smith chart 300 of the response of a model of the circuit shown in FIG. 2. In the model, the reactance X is a variable capacitor C and the resistor R is also variable. The calculated response is for selected scattering parameters (or S-parameters) having the mapping shown in TABLE 1, at a characteristic impedance of 50 ohms. For the illustrated chart, the frequency was about 30 GHz, the value of the resistor R was swept from about 1500 ohms to about 100 ohms in 50 ohm steps, and the value of the capacitor C was swept from about 5 fF to about 150 fF in 5 fF steps.

TABLE 1

| S-Parameter Port # | Hybrid Coupler Port |
|---|---|
| 1 | Input Port ① |
| 2 | Isolated Port ② |

The Smith chart 300 shows that over all combinations of R and C, the input and output impedance match to the circuit stays well behaved at the selected frequency, as indicated by the tight cluster of points near the center of the chart (the separate sets of measurements for S(1,1) and S(2,2) in fact overlap).

FIG. 3B is a polar plot 302 of the S(2,1) response of a model of the circuit shown in FIG. 2. While the circuit shown in FIG. 2 may be useful in some applications, the plot in FIG. 3B illustrates two characteristics of the circuit shown in FIG. 2 that could use improvement. First, the area bounded by the ellipse 304 indicates a collapse of the attenuation range of the circuit. Second, the sector bracketed by the dotted lines 306 represents less than ideal behavior— it would be preferable if each of the plotted curves more closely conformed to a circular segment centered on the polar plot background (that is, if the plotted dots fell on concentric circles centered at 0.0). Further, ideally the bracketed sector should be as large as possible, within the limits of practical circuit components for an IC (note that the rotational position of the bracketed sector on the polar plot is somewhat arbitrary).

Figure 4:
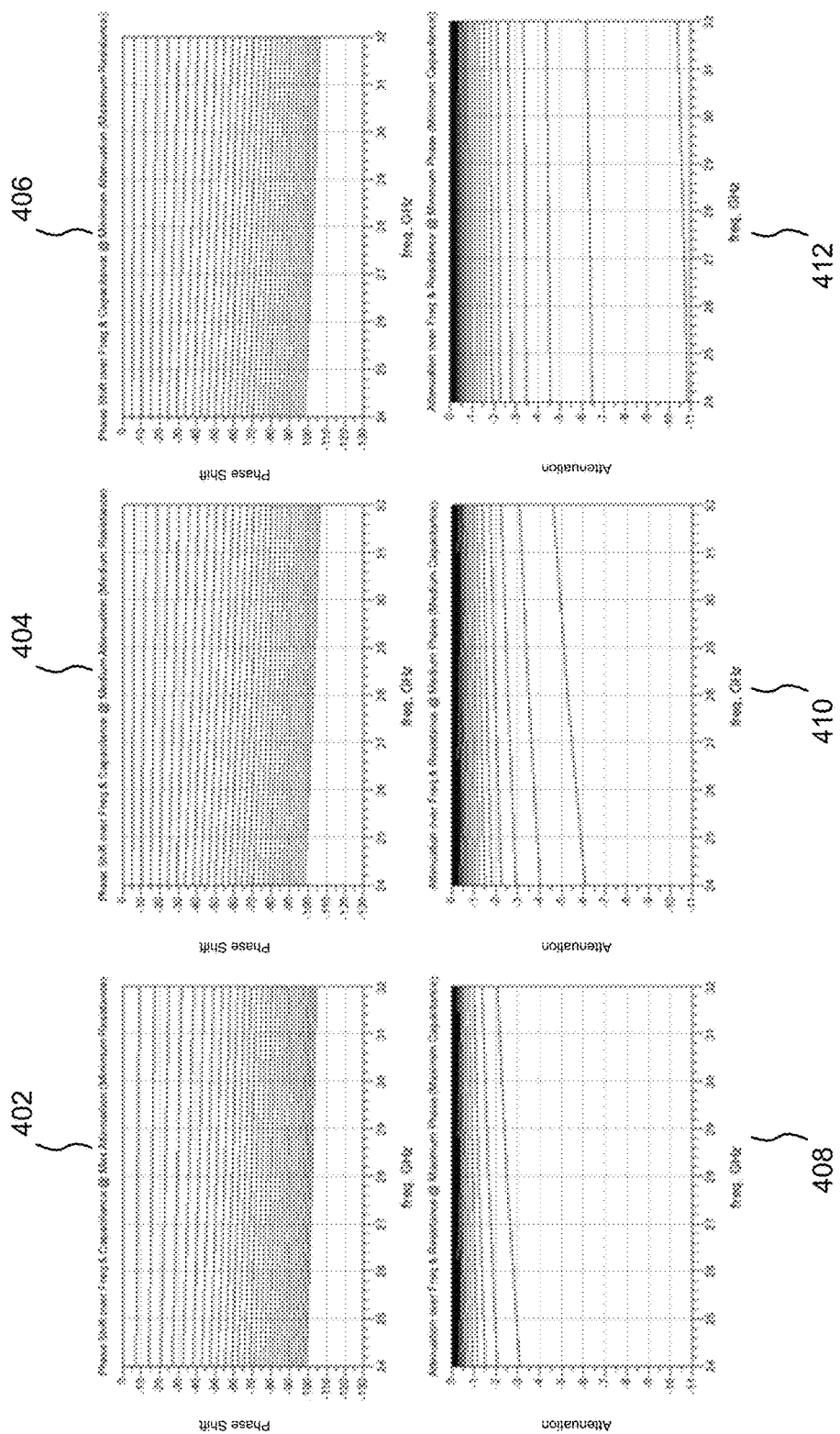
FIG. 4 is a set of graphs showing phase shift and attenuation as a function of frequency and component variation (R and C) for the circuit of FIG. 2.

FIG. 4 is a set of graphs showing phase shift and attenuation as a function of frequency and component variation (R and C) for the circuit of FIG. 2. More specifically, focusing on phase shift, graph 402 shows phase shift versus frequency as capacitance is stepped when the circuit is configured to be at maximum attenuation (i.e., R is as a minimum value); graph 404 shows phase shift versus frequency as capacitance is stepped when the circuit is configured to be at medium attenuation (i.e., R is as a medium value); and graph 406 shows phase shift versus frequency as capacitance is stepped when the circuit is configured to be at minimum attenuation (i.e., R is as a maximum value). Similarly, focusing on attenuation, graph 408 shows attenuation versus frequency as resistance is stepped when the circuit is configured to be at maximum phase shift (i.e., C is as a maximum value); graph 410 shows attenuation versus frequency as resistance is stepped when the circuit is configured to be at medium phase shift (i.e., C is as a medium value); and graph 412 shows attenuation versus frequency as resistance is stepped when the circuit is configured to be at minimum phase shift (i.e., C is as a minimum value).

Two conclusions are apparent from the graphs of FIG. 4. First, phase shift performance is fairly flat with respect to frequency and essentially invariant with respect to attenuation stepping—that is, graphs 402, 404, and 406 are the same for all practical purposes. Second, attenuation performance is fairly flat as frequency varies but exhibits severe control range collapse at high phase settings as phase shift (capacitance) is increased, as best shown by graph 408, where the full range of available attenuation states results in only about a third of the range of available attenuation states shown in graph 412.

Second Embodiment

While the combined phase shifter and attenuator hybrid coupler circuit shown in FIG. 2 may be useful in a number of applications, performance can be improved with a modification to the circuit. FIG. 5 is a schematic diagram 500 of a second embodiment of a hybrid coupler 202 in a combined phase shifter and attenuator configuration. Again, the hybrid coupler 202 may be of any of the types described above, but a Lange coupler (conventional or folded) is particularly useful in an IC implementation. The hybrid coupler 202 has its termination ports coupled to parallel resistance-reactance (RX) circuits 502a, 502b, which, in the simplest form, comprise a resistor R coupled in parallel with a reactance X, which may be a capacitive element or an inductive element.

In addition, series coupled between each parallel RX circuit 502a, 502b and RF ground is an attenuation compensation element (ACE), which for parallel RC circuits, is an inductive element L, and which for parallel RL circuits, is a capacitive element C. The ACE corrects for attenuation range collapse while providing for fairly flat phase shift and attenuation performance as a function of frequency.

In many applications where the ACE may be an inductive element L, particularly in IC implementations, it is convenient to utilize a transmission line as the inductive element L, with substantially the same effect as a conventional inductor. For an IC embodiment, such a transmission line is preferably implemented as a microstrip transmission line, but in some applications may be implemented as a stripline transmission line, a co-planar waveguide, or an equivalent structure or circuit.

In some embodiments, the ACE may be variable in value. For example, an ACE implemented as an inductive element L may comprise a variable-value inductor or one or more inductors and/or transmission lines connected to one or more switch elements so that one or more of the individual inductors and/or transmission lines may be switched into circuit (e.g., under digital control), thus allowing the value of L to be varied. Similarly, an ACE implemented as a capacitive element C may comprise a variable-value capacitor or varactor, or one or more capacitors and/or varactors connected to one or more switch elements so that one or more of the individual capacitors and/or varactors may be switched into circuit (e.g., under digital control), thus allowing the value of C to be varied.

As with FIG. 2, in alternative embodiments, the parallel RX circuits 502a, 502b may be more complex parallel RC, RL, and/or RLC circuits. For example, one or more of the components may be variable in value so as to provide for selectable value states. Thus, the resistor R may be a fixed-resistance component, or a variable resistance transistor, or a set of parallel fixed-resistances each in series with a corresponding switch element (e.g., a FET) so that one or more of the individual resistances may be switched into circuit. Similarly, the reactance X may be a fixed-value or variable-value capacitor or inductor, or a network of fixed-value capacitors and/or inductors connected to one or more switch elements so that one or more of the individual capacitors and/or inductors may be switched into circuit. In some implementations, a variable capacitor may be a variable capacitance diode (varactor). As should be apparent, other combinations of RC, RL, and/or RLC circuits may be used for the parallel RX circuits 502a, 502b to achieve desired design parameters. For example, in one embodiment, the reactance X in the parallel RX circuit 502a may be a capacitance element C while the reactance X in the parallel RX circuit 502b may be an inductive element L. Further, the values of the component R, C, L, and ACE elements need not be the same for each of the termination circuits.

FIG. 6A is a Smith chart 600 of the response of a model of the circuit shown in FIG. 5. In the model, the reactance X is a variable capacitor C and the resistor R is also variable.

In the modeled embodiment, the ACE is an inductive element L implemented as a transmission line having an electrical length that provided approximately 30° of phase shift. The calculated response is for selected S-parameters having the mapping shown in TABLE 1 above, at a characteristic impedance of 50 ohms. For the illustrated chart, the frequency was about 30 GHz, the value of the resistor R was swept from about 1500 ohms to about 100 ohms in 50 ohm steps, and the value of the capacitor C was swept from about 5 fF to about 150 fF in 5 fF steps.

The Smith chart 600 shows that over all selected combinations of R and C, the input and output impedance match to the circuit stays well behaved at the selected frequency, as indicated by the tight cluster of points near the center of the chart (the separate sets of measurements for S(1,1) and S(2,2) in fact overlap).

FIG. 6B is a polar plot 602 of the S(2,1) response of a model of the circuit shown in FIG. 5. The plot is similar to the plot shown in FIG. 3B, but the end of the phase range bounded by the ellipse is rotated clockwise about 30° as one effect of the inductive element L. In addition, the area bounded by the ellipse 606 indicates an expansion of the circuit's attenuation range compared to the circuit shown in FIG. 2, and the sector bracketed by the dotted lines 608 indicates better conformity of the plot points to a circular segment centered on the polar plot background, both of which are significant benefits resulting from the addition of the inductive element L. In a practical product, it may be useful to constrain the range of operation of the circuit shown in FIG. 5 to operate with values that fall within the sector bracketed by the dotted lines 608.

The polar plot 602 of FIG. 6B shows one way of determining the degree of phase shift of the inductive element L for a particular parallel RC-based circuit. Polar plots of different circuit models having different values for the inductive element L may be visually compared to determine which value best conforms the corresponding plot points to a circular segment centered on the polar plot background and exhibits an acceptable degree of range collapse. Of course, such a comparison may also be done by comparing the underlying plot point values in a table form or by a suitably programmed computer. A similar technique may be used for determining the degree of phase shift of a capacitive element C for a particular parallel RL-based circuit.

Figure 6C:
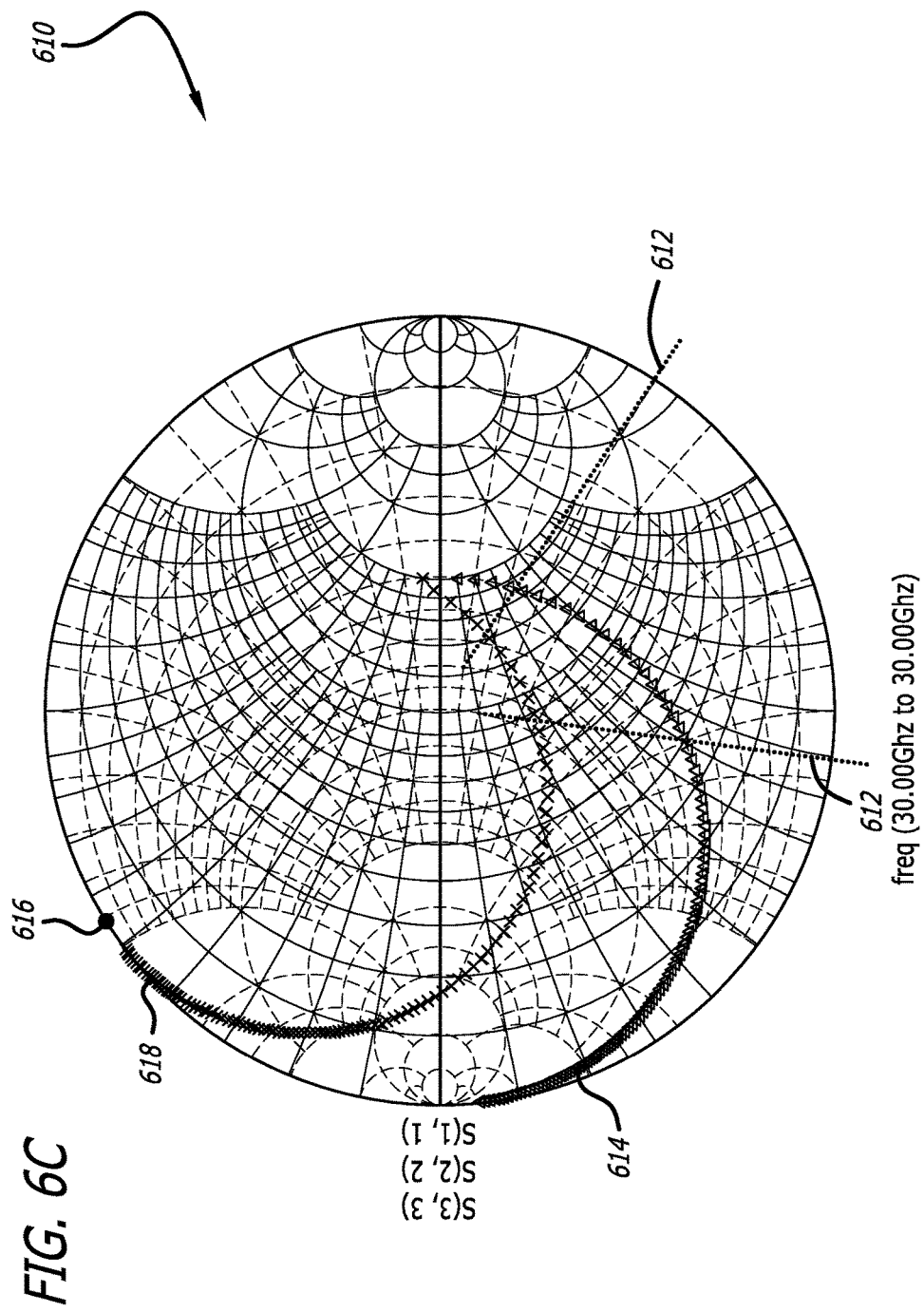
FIG. 6C is a Smith chart that better explains the beneficial effect of adding an inductive element L to a parallel RC-based version of the circuit in FIG. 5.

FIG. 6C is a Smith chart 610 that better explains the beneficial effect of adding an inductive element L to a parallel RC-based version of the circuit in FIG. 5. The Smith Chart is plotted at a spot frequency of about 30 GHz, is normalized to 50 ohms, and displays both impedance and admittance scales. The region bracketed by the dotted lines 612 has been selected as the sector where improved performance is desired.

Consider first the circuit in FIG. 2 with just the parallel RX circuits 204a, 204b, where X is a capacitor C. For the case where the value of the capacitor C is small, each parallel RC circuit effectively reduces to a shunt resistor. Taking a resistor value of 100 ohms as an example, S11 (referencing just the parallel RC circuit as port 1) is plotted as a graph line 614 on the real axis, starting at point Z=2 (Y=0.5). As the value of the capacitor C increases, the impedance becomes complex and follows a trajectory clockwise along a constant resistance circle, where in the limit it becomes a short circuit. Examining the trajectory in the sector of interest bracketed by the dotted lines 612, it can be seen that the Voltage Standing Wave Ratio (VSWR) changes across the sector, which causes the attenuation range collapse noted above when just parallel RC circuits are used as terminating circuits in a hybrid based phase shifter.

Referring again to the Smith chart, S22 (referencing just the inductive element L as port 2) is plotted on the Smith chart as a solid black dot 616 representing only the inductive element L, modeled as a short length of transmission line (RF grounded at one end) that provides about 30° of phase shift.

The plot of S(3,3) (referencing the parallel RC circuit plus inductive element L as port 3) is a graph line 618 that represents the series combination of the parallel RC circuit and the inductive element L, showing the effect of increasing the value of the capacitor C. The effect of the inductive element L can be thought of as rotating the RF ground reference for the RC part of the circuit around the Smith chart, in this example by about 30°. This conceptual rotation provides benefit in the sector of interest, where it can now be seen that the trajectory of the S(3,3) graph line 618 as capacitance is varied more closely follows a constant VSWR circle, which is the desired outcome. In effect, the inventive concept encompasses a circuit with a reflection coefficient that can be "steered" around a range of constant VSWR circles. When such a circuit is connected as a reflection termination in a hybrid-coupler based phase shifter, the constant VSWR circle radii map to attenuation settings, and variation around a sector of each such circle maps to phase settings.

Figure 7:
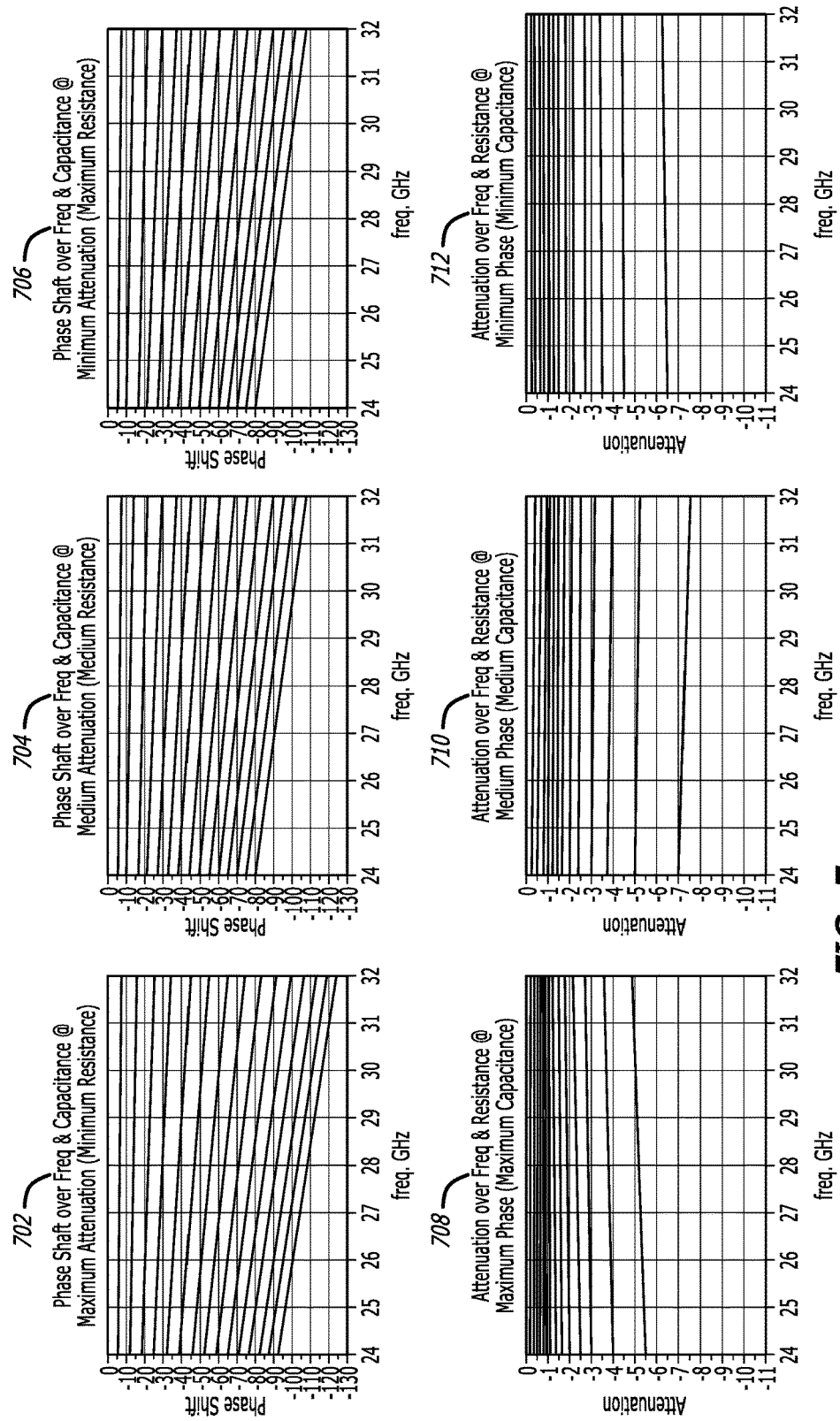
FIG. 7 is a set of graphs showing phase shift and attenuation as a function of frequency and component variation (R and C) for an ideal model of the circuit of FIG. 5.

FIG. 7 is a set of graphs showing phase shift and attenuation as a function of frequency and component variation (R and C) for an ideal model of the circuit of FIG. 5. More specifically, focusing on phase shift, graph 702 shows phase shift versus frequency as capacitance is stepped when the circuit is configured to be at maximum attenuation (i.e., R is as a minimum value); graph 704 shows phase shift versus frequency as capacitance is stepped when the circuit is configured to be at medium attenuation (i.e., R is as a medium value); and graph 706 shows phase shift versus frequency as capacitance is stepped when the circuit is configured to be at minimum attenuation (i.e., R is as a maximum value). Similarly, focusing on attenuation, graph 708 shows attenuation versus frequency as resistance is stepped when the circuit is configured to be at maximum phase shift (i.e., C is as a maximum value); graph 710 shows attenuation versus frequency as resistance is stepped when the circuit is configured to be at medium phase shift (i.e., C is as a medium value); and graph 712 shows attenuation versus frequency as resistance is stepped when the circuit is configured to be at minimum phase shift (i.e., C is as a minimum value). (Note that while the graphs in FIG. 7 are similar to the graphs in FIG. 4, due to the range expansion effect of adding an inductive element L as the ACE, the sweep range for C and R have been reduced somewhat to limit the phase shift to around 100° for a better comparison to FIG. 4.)

As is often the case with RF circuits, the graphs of FIG. 7 demonstrate that a seemingly small change to an RF circuit can result in a significant difference in performance. In particular, the graphs of FIG. 7 demonstrate that, by the addition of the inductive element L as the ACE for a parallel RC circuit, the attenuation range collapse apparent in the graphs of FIG. 4 has been significantly mitigated, so that graphs 708, 710, and 712 are substantially similar. While some increased frequency-dependent slope has been introduced in the phase shift graphs 702, 704, and 706, there is reasonably good uniformity between such graphs.

Optimized Tunable Embodiment

A better balance between the performance of the attenuation characteristics and the phase shift characteristics of the circuit shown in FIG. 5 can be achieved by modeling the circuit as an entirety to take into account the fabrication technology (e.g., SOI), the $R_{ON}$ and $C_{OFF}$ values of any FET switches in the circuit, as well as other parasitic capacitances, inductances, and resistances from bond wires, circuit traces, component proximity, etc., as appropriate. Such "practical circuit" modeling allows selection of optimized values for the component elements of the parallel RX circuits 502a, 502b and the ACE of the circuit shown in FIG. 5. In addition, by implementing the parallel RX circuits 502a, 502b with variable components, the attenuation and phase shift characteristics can be tuned for an optimum balance for a particular circuit and application. Similarly, by implementing the ACE with variable components, the degree of attenuation compensation can be tuned for an optimum balance for a particular circuit and application.

Figure 8A:
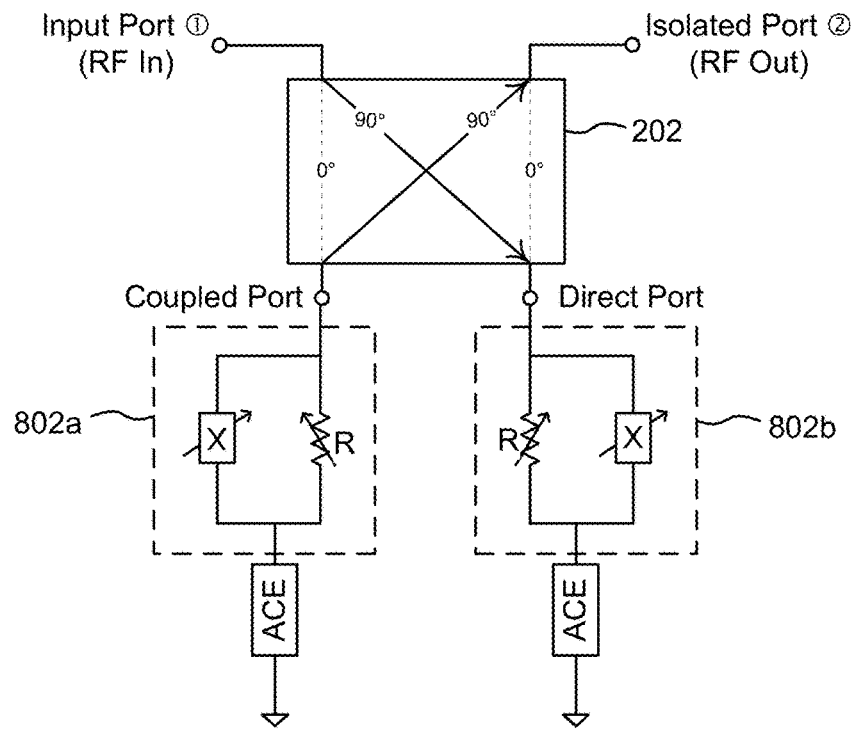
FIG. 8A is a schematic diagram of a third embodiment of a hybrid coupler in a combined tunable phase shifter and attenuator configuration.

For example, FIG. 8A is a schematic diagram 800 of a third embodiment of a hybrid coupler 202 in a combined tunable phase shifter and attenuator configuration. Again, the hybrid coupler 202 may be of any of the types described above, but a Lange coupler (conventional or folded) is particularly useful in an IC implementation. The hybrid coupler 202 has its termination ports coupled to tunable parallel RX circuits 802a, 802b. In addition, a fixed or variable ACE is series coupled between each tunable parallel RX circuit 802a, 802b and RF ground; in some embodiments, the ACE may be variable in value. In the illustrated embodiment, the tunable parallel RX circuits 802a, 802b comprise a variable resistor R coupled in parallel with a variable reactance X, which may be a variable capacitive element C or a variable inductive element L. However, in alternative embodiments, only one of the components of the tunable parallel RX circuits 802a, 802b may be variable.

Figure 8B:
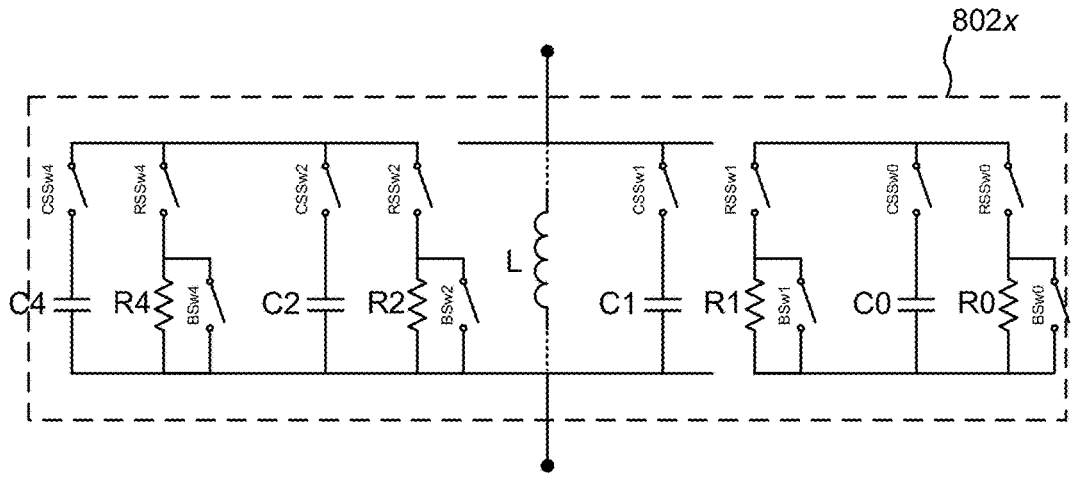
FIG. 8B is a detailed schematic diagram of one example of a digitally tunable parallel RC circuit suitable for use in the circuit shown in FIG. 8A.

FIG. 8B is a detailed schematic diagram of one example of a digitally tunable parallel RC circuit 802x suitable for use in the circuit shown in FIG. 8A. As illustrated, any of four resistors R0-R4 can be selectively switched into circuit by activating a corresponding resistor series switch RSSw0-RSSw4 (e.g., under digital control, not shown). Each resistor R0-R4 may also be bypassed when not in use by activating a corresponding optional bypass switch BSw0-BSw4; doing so avoids introducing parasitic RC network effects which may lead to unnecessary phase shifts during state changes and circuit bandwidth reduction. The variable reactance elements shown in the tunable parallel RX circuits 802a, 802b of FIG. 8A are implemented as a selectable capacitor network in FIG. 8B. As illustrated, any of four capacitors C0-C4 can be selectively switched into circuit by activating a corresponding capacitor series switch CSSw0-CSSw4 (e.g., under digital control). The resistors R0-R4 and the capacitors C0-C4 may be binary coded, thermometer coded, hybrid binary and thermometer coded, or coded in some other fashion. The coding need not be the same for both—for example, the capacitors C0-C4 may be thermometer coded, while the resistors R0-R4 may be binary coded. Also shown is an optional parallel inductive element L (shown with dotted-line connections) that may provide a further degree of freedom in adjustment and may make the range of values needed for the capacitors C0-C4 more practical, as described above. If a parallel RL circuit is used, an optional parallel capacitive element may be used.

The switches in FIG. 8B may be implemented as FETs local to the components they are switching on an IC. The digital control signals come from a remote digital source, and may be provided to the switches by means of the well-known interfaces specified by the MIPI (Mobile Industry Processor Interface) Alliance, or through the well-known Serial Peripheral Interface (SPI) bus, or by direct control signal pins, or by any other convenient means. Supplied digital control signals may be directly coupled to associated FET switches, or be processed through combinatorial logic circuitry or a mapping circuit (e.g., a lookup table) before being coupled to associated FET switches directly or through driver circuits.

While four resistors R0-R4 and four capacitors C0-C4 are shown in FIG. 8B, more or fewer of each may be used. In particular, it may be useful to overprovision the number of resistors and/or reactance elements so that a subset of such elements can be mapped to a coding of control bits that best provides evenly spaced phase shift states and/or attenuation states. For example, if six capacitors were available in the tunable parallel RX circuit 802x of FIG. 8B, then a subset of four of them may be selected as best providing evenly spaced phase shift states. Alternatively, some of the extra capacitors may be used to "tweak" the tunable parallel RX circuit 802x to achieve a desired base or "reference" state which is thereafter varied by switching in other capacitors during normal circuit operation. Similar considerations apply to adding and utilizing extra resistors for overprovisioning and/or tweaking purposes. Further examples of using extra elements in the context of phase shifting are set forth in U.S. patent application Ser. No. 14/988,463, filed Jan. 5, 2016, entitled Reflection-Based RF Phase Shifter and assigned to the assignee of the present invention, the teachings of which are hereby incorporated by reference.

Figure 9:
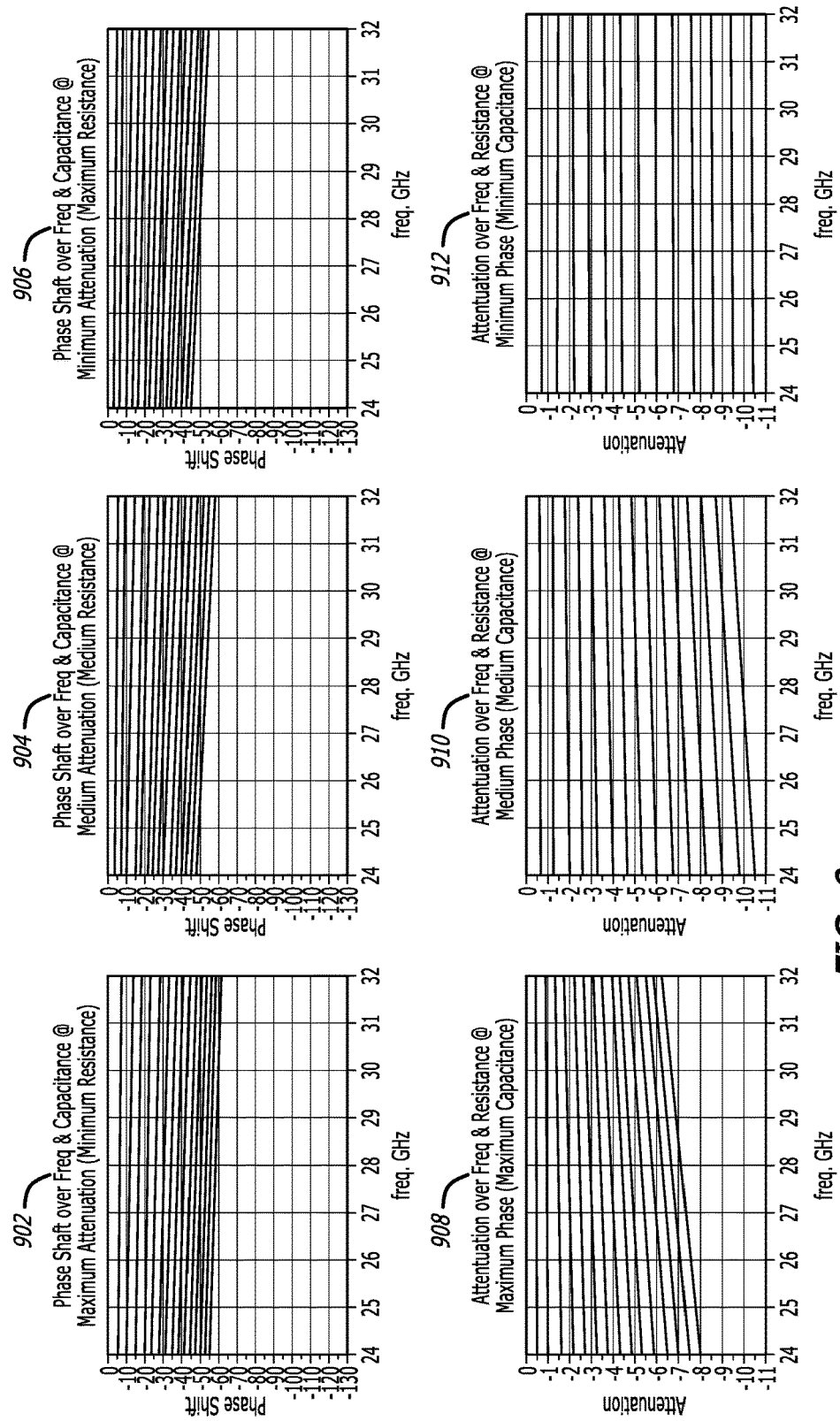
FIG. 9 is a set of graphs showing phase shift and attenuation as a function of frequency and component variation (R and C) for the practical circuit model of FIG. 8A and FIG. 8B.

FIG. 9 is a set of graphs showing phase shift and attenuation as a function of frequency and component variation (R and C) for the practical circuit model of FIG. 8A and FIG. 8B. In this example, the ACE is an inductive element L and the practical circuit model has been tuned for optimal performance over a phase shift range of at least 45° and an attenuation range of at least 6 dB when implemented with an SOI based technology. Focusing on phase shift, graph 902 shows phase shift versus frequency as capacitance is stepped when the circuit is configured to be at maximum attenuation (i.e., R is as a minimum value); graph 904 shows phase shift versus frequency as capacitance is stepped when the circuit is configured to be at medium attenuation (i.e., R is as a medium value); and graph 906 shows phase shift versus frequency as capacitance is stepped when the circuit is configured to be at minimum attenuation (i.e., R is as a maximum value). Similarly, focusing on attenuation, graph 908 shows attenuation versus frequency as resistance is stepped when the circuit is configured to be at maximum phase shift (i.e., C is as a maximum value); graph 910 shows attenuation versus frequency as resistance is stepped when the circuit is configured to be at medium phase shift (i.e., C is as a medium value); and graph 912 shows attenuation versus frequency as resistance is stepped when the circuit is configured to be at minimum phase shift (i.e., C is as a minimum value).

Comparing the practical circuit graphs of FIG. 9 to the ideal circuit graphs of FIG. 7, the phase shift performance of the former is fairly flat with respect to frequency and essentially invariant with respect to attenuation stepping— that is, graphs 902, 904, and 906 are the same for all practical purposes. In addition, the graphs of FIG. 9 demonstrate that the attenuation range collapse apparent in the graphs of FIG. 4 has been significantly mitigated.

Cascaded Circuits

Figure 10:
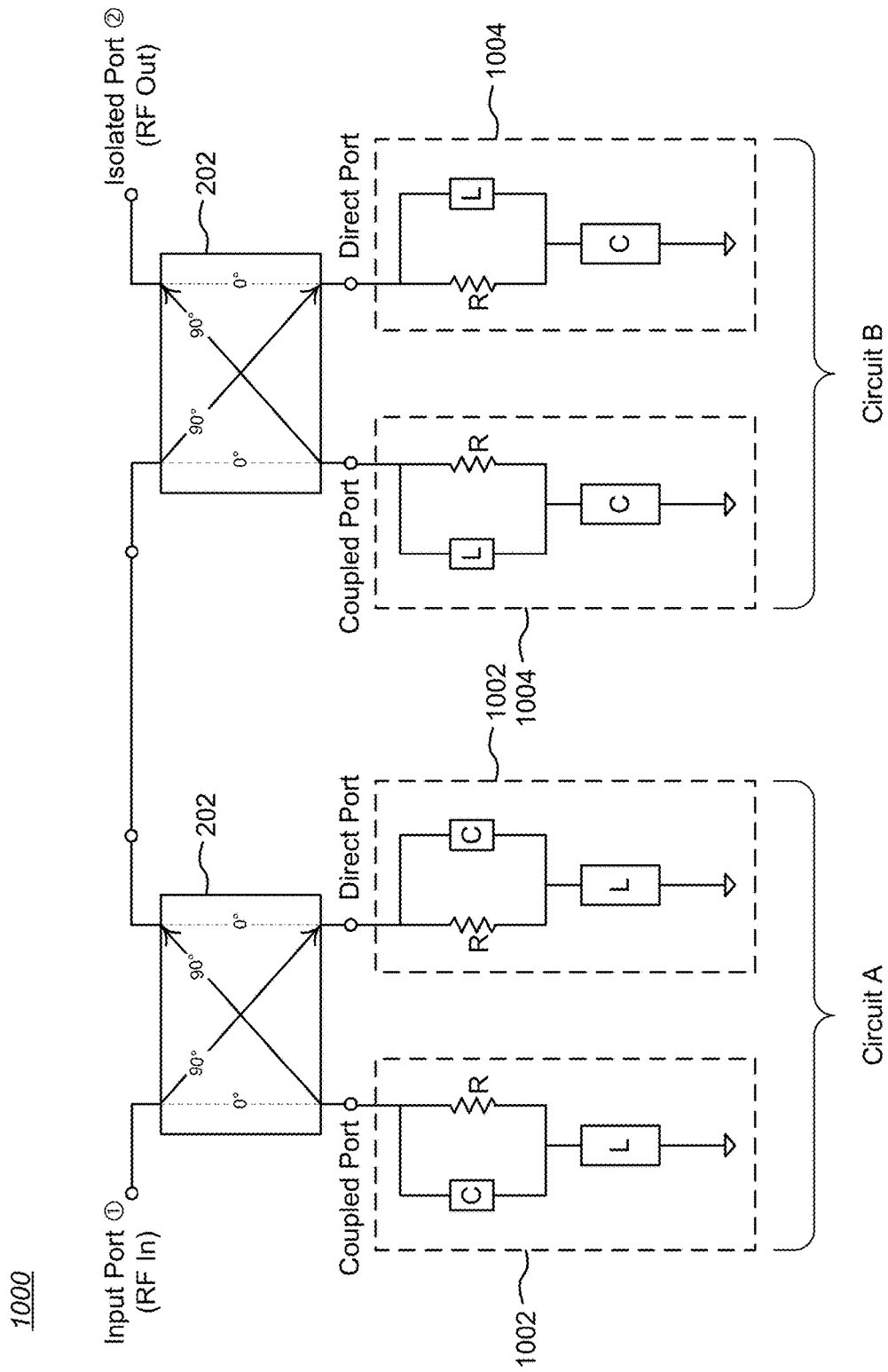
FIG. 10 is a schematic diagram of an embodiment of cascaded hybrid couplers, each in a combined phase shifter and attenuator configuration.
Figure 11:
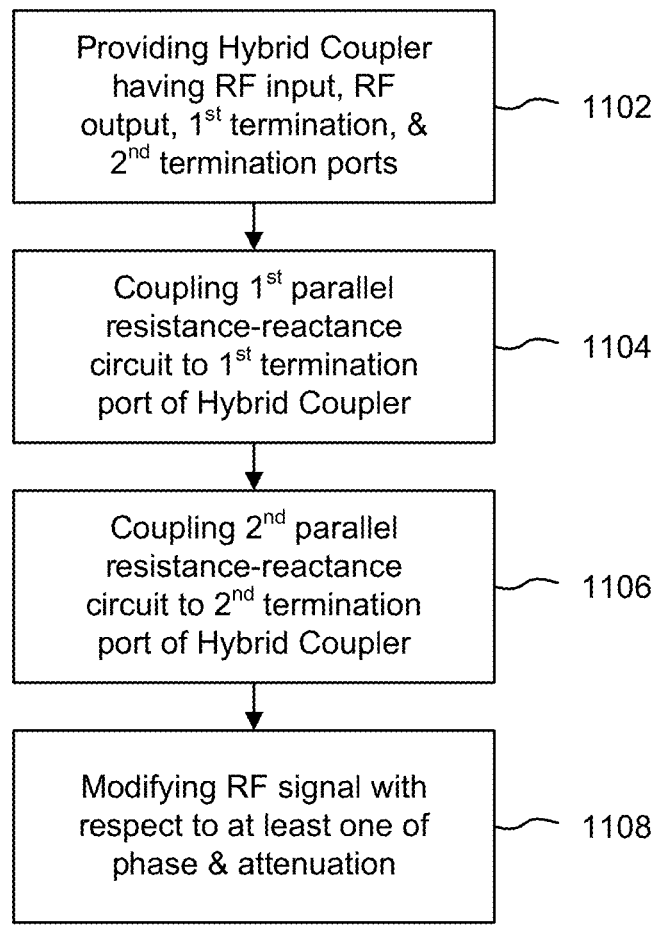
FIG. 11 is a process flow chart showing one method for controlling phase and attenuation for an RF signal.

As the graphs of FIG. 9 indicate, there may still be some residual slope in phase shift and frequency as a function of frequency. In some applications, it may be useful to minimize or eliminate that characteristic by cascading two hybrid couplers 202 in a combined phase shifter and attenuator configuration, each with opposite frequency-dependent slopes. For example, FIG. 10 is a schematic diagram 1000 of an embodiment of cascaded hybrid couplers, each in a combined phase shifter and attenuator configuration. In each of Circuit A and Circuit B, a hybrid coupler 202 is coupled to corresponding terminating circuits 1002, 1004 which may be configured as in FIG. 5 or FIG. 8A. In the illustrated embodiment, the terminating circuits 1002 of Circuit A utilize a parallel RC circuit and a corresponding inductive element L as the ACE, which generates phase shift versus frequency and attenuation versus frequency graphs as shown in FIG. 7. However, the terminating circuits 1004 of Circuit B utilize a parallel RL circuit and a corresponding capacitive element C as the ACE, which would generate phase shift versus frequency and attenuation versus frequency graphs having an opposite slope to the graphs shown in FIG. 7. In other embodiments, the parallel RC and RL circuits in the terminating circuits 1002, 1004 may be more complex parallel RC, RL, and/or RLC circuits, and the ACE may be implemented with variable components.

In operation for most applications, the phase states in each of Circuit A and Circuit B would be selected in parallel, with each combination of phases states for the two circuits having a complimentary phase slope. Accordingly, the slopes would substantially cancel each other out, resulting in nearly flat responses versus frequency. The cascaded circuit FIG. 10 also would have a phase shift and attenuation range of close to the sum of the individual circuits (typically approaching twice that of a single circuit, but with doubled step sizes), but with the benefit of flatter performance with respect to frequency.

Note that the coupling order of Circuit A and Circuit B can be reversed with the same results, and that Circuit A and/or Circuit B may be configured like the circuit of FIG. 2 in some applications. In addition, Circuit A and Circuit B do not necessarily need to be coupled port-to-port, as shown—in most cases, just being positioned within the same cascaded network is sufficient to provide the desired benefits. Thus, with respect to embodiments of the present invention, "cascaded", "series-connected", "series coupled", "connected in series", or "coupled in series" includes direct or indirect (i.e., through intermediate components) series connections. Further, more than two hybrid couplers 202 in a combined phase shifter and attenuator configuration (i.e., Circuit A to Circuit X) may be series-connected (directly or through intermediate components) for added phase shift and attenuation ranges.

Further, sets of series-coupled hybrid couplers 202 in a combined phase shifter and attenuator configuration may be connected in parallel in a switched configuration, so that one series set may be selected at a time, for example, to provide different phase shift and attenuation ranges. In addition, each component hybrid coupler 202 in a combined phase shifter and attenuator configuration coupled in a cascade (e.g., Circuit A and Circuit B) may have different phase shifter and attenuator ranges. Thus, as one example, Circuit A may be configured to provide a coarse range of phase shift and attenuation settings, while Circuit B may be configured to provide a fine range of phase shift and attenuation settings. As another example, Circuit A may be configured to provide a coarse range of phase shift settings and a fine range of attenuation settings, while Circuit B may be configured to provide a fine range of phase shift settings and a coarse range of attenuation settings. As should be apparent, other combinations of RC, RL, and/or RLC circuits may be used in the cascaded circuits (i.e., Circuit A to Circuit X), and the tuning characteristics of the cascaded circuits may be partitioned into a variety of other configurations.

It should be appreciated by those skilled in the art that combining a hybrid coupler with components for phase shifting and attenuation saves IC layout space. In addition, as demonstrated above, embodiments of the invention provide a sufficiently useful control range in both phase and attenuation with minimum interaction between both, and achieve a flat performance over a broad frequency range.

Methods

Another aspect of the invention includes a method for controlling phase and attenuation for an RF signal, including: providing a hybrid coupler having an RF input port for receiving an RF signal, an RF output port for outputting the RF signal after modification of at least one of phase and attenuation, a first termination port, and a second termination port; providing a first parallel resistance-reactance circuit coupled between the first termination port and RF ground; providing a second parallel resistance-reactance circuit coupled between the second termination port and a RF ground; and modifying the RF signal with respect to at least one of phase and attenuation.

Yet another aspect of the invention includes a method for controlling phase and attenuation for an RF signal, including: providing a hybrid coupler having an RF input port for receiving an RF signal, an RF output port for outputting the RF signal after modification of at least one of phase and attenuation, a first termination port, and a second termination port; providing a first parallel resistance-reactance circuit coupled to the first termination port; providing a first attenuation compensation element coupled between the first parallel resistance-reactance circuit and RF ground; providing a second parallel resistance-reactance circuit coupled to the second termination port; providing a second attenuation compensation element coupled between the second parallel resistance-reactance circuit and RF ground; and modifying the RF signal with respect to at least one of phase and attenuation.

Still another aspect of the invention includes a method for controlling phase and attenuation for an RF signal, including: providing series-connected first and second circuits, each circuit including a hybrid coupler having an RF input port, an RF output port, a first termination port, and a second termination port; a first parallel resistance-reactance circuit coupled to the first termination port; a first attenuation compensation element coupled between the first parallel resistance-reactance circuit and RF ground; a second parallel resistance-reactance circuit coupled to the second termination port; and a second attenuation compensation element coupled between the second parallel resistance-reactance circuit and RF ground; configuring the reactances in the parallel resistance-reactance circuits of the first circuit as capacitances; configuring the reactances in the parallel resistance-reactance circuits of the second circuit is inductances; and modifying the RF signal with respect to at least one of phase and attenuation.

Additional aspects of the above methods include: each parallel resistance-reactance circuit being a parallel resistor-capacitor circuit; providing an inductor coupled in parallel with each parallel resistor-capacitor circuit; each parallel resistance-reactance circuit being a parallel resistor-inductor circuit; providing a capacitor coupled in parallel with each parallel resistor-inductor circuit; each attenuation compensation element being one of an inductive element or a capacitive element; at least one parallel resistance-reactance circuit having a variable resistance; at least one parallel resistance-reactance circuit having a variable reactance; the variable reactance being a variable capacitance; the variable reactance being a variable inductance; at least one parallel resistance-reactance circuit having a variable resistance and a variable reactance; at least one parallel resistance-reactance circuit being a digitally tunable parallel resistance-reactance circuit; the hybrid coupler being a Lange coupler; and at least one attenuation compensation element being a transmission line.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits. Further, as should be readily apparent to one of ordinary skill in the art, various embodiments of the invention may take into account the RF characteristics (e.g., distributed effects) of various components and may include additional circuit elements to adjust or compensate for such characteristics. For example, at high radio frequencies, a pure resistor cannot be readily implemented in actual ICs—an actual resistor will have some physical length which introduces effects other than resistance alone, such as parasitic capacitance and/or inductance. Similarly, actual inductive and capacitive elements may include a resistive characteristic and also exhibit distributed effects on other components. Accordingly, where resistive R, capacitively C, and inductive L components have been specified above, it should be understood that such components may be implemented by elements that are substantially resistive, substantially capacitive, and substantially inductive, respectively.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A hybrid coupler with phase and attenuation control, including:
    (a) a hybrid coupler having an RF input port, an RF output port, a first termination port, and a second termination port; (b) a first parallel resistance-reactance circuit coupled between the first termination port and RF ground, wherein the resistance-reactance circuit includes a resistor connected directly between the first termination port and RF ground; and (c) a second parallel resistance-reactance circuit coupled between the second termination port and RF ground, wherein the second resistance-reactance circuit includes a resistor connected directly between the second termination port and RF ground.

2. The invention of claim 1, wherein at least one parallel resistance-reactance circuits is a parallel resistor-capacitor circuit.

3. The invention of claim 2, wherein at least one parallel resistor-capacitor circuit further includes a parallel inductor.

4. The invention of claim 1, wherein at least one parallel resistance-reactance circuit is a parallel resistor-inductor circuit.

5. The invention of claim 4, wherein at least one parallel resistor-inductor circuit further includes a parallel capacitor.

6. The invention of claim 1, wherein at least one parallel resistance-reactance circuit has a variable resistance.

7. The invention of claim 1, wherein at least one parallel resistance-reactance circuit has a variable reactance.

8. The invention of claim 7, wherein the variable reactance is a variable capacitance.

9. The invention of claim 7, wherein the variable reactance is a variable inductance.

10. The invention of claim 1, wherein at least one parallel resistance-reactance circuit has a variable resistance and a variable reactance.

11. The invention of claim 1, wherein at least one parallel resistance-reactance circuit is a digitally tunable parallel resistance-reactance circuit.

12. The invention of claim 1, wherein the hybrid coupler is a Lange coupler.

13. A cascaded hybrid coupler with phase and attenuation control, including:
   (a) a first hybrid coupler with phase and attenuation control, the first hybrid coupler having an RF input port, an RF output port, a first termination port, and a second termination port, the first hybrid coupler further having a first parallel resistance-reactance circuit coupled between the first termination port and RF ground, and a second parallel resistance-reactance circuit coupled between the second termination port and RF ground; and
   (b) a second hybrid coupler with phase and attenuation control, the second hybrid coupler having an RF input port coupled to the RF output port of the first hybrid coupler, an RF output port, a third termination port, and a fourth termination port, the second hybrid coupler further having a third parallel resistance-reactance circuit coupled between the third termination port and RF ground, and a fourth parallel resistance-reactance circuit coupled between the fourth termination port and RF ground;
wherein the reactances in the parallel resistance-reactance circuits of one of the first or second hybrid coupler are capacitive, and the reactances in the parallel resistance-reactance circuits of the other of the first or second hybrid coupler are inductive, and wherein the first and second hybrid couplers have opposite frequency-dependent slopes for phase shift and attenuation.

14. A hybrid coupler with phase and attenuation control, including:
   (a) a hybrid coupler having an RF input port, an RF output port, a first termination port, and a second termination port;
   (b) a first parallel resistance-reactance circuit coupled to the first termination port;
   (c) a first attenuation compensation element coupled in series between the first parallel resistance-reactance circuit and RF ground;
   (d) a second parallel resistance-reactance circuit coupled to the second termination port; and
   (e) a second attenuation compensation element coupled in series between the second parallel resistance-reactance circuit and RF ground.

15. The invention of claim 14, wherein at least one of the first and second parallel resistance-reactance circuits is a parallel resistor-capacitor circuit.

16. The invention of claim 15, wherein at least one parallel resistor-capacitor circuit further includes a parallel inductor.

17. The invention of claim 15, wherein at least one attenuation compensation element is an inductive element.

18. The invention of claim 14, wherein at least one of the first and second parallel resistance-reactance circuits is a parallel resistor-inductor circuit.

19. The invention of claim 18, wherein at least one parallel resistor-inductor circuit further includes a parallel capacitor.

20. The invention of claim 18, wherein at least one attenuation compensation element is a capacitive element.

21. The invention of claim 14, wherein at least one parallel resistance-reactance circuit has a variable resistance.

22. The invention of claim 14, wherein at least one parallel resistance-reactance circuit has a variable reactance.

23. The invention of claim 22, wherein the variable reactance is a variable capacitance.

24. The invention of claim 22, wherein the variable reactance is a variable inductance.

25. The invention of claim 14, wherein at least one parallel resistance-reactance circuit has a variable resistance and a variable reactance.

26. The invention of claim 14, wherein at least one parallel resistance-reactance circuit is a digitally tunable parallel resistance-reactance circuit.

27. The invention of claim 14, wherein the hybrid coupler is a Lange coupler.

28. The invention of claim 14, wherein at least one attenuation compensation element is a transmission line.

29. The invention of claim 14, further including a second hybrid coupler with phase and attenuation control series connected to the hybrid coupler with phase and attenuation control, wherein the reactances in the parallel resistance-reactance circuits of the hybrid coupler with phase and attenuation control are capacitive, and the reactances in the parallel resistance-reactance circuits of the second hybrid coupler with phase and attenuation control are inductive.

30. A combination phase shifter and attenuator, including series-connected first and second circuits, each circuit including:
   (a) a hybrid coupler having an RF input port, an RF output port, a first termination port, and a second termination port;
   (b) a first parallel resistance-reactance circuit coupled to the first termination port;
   (c) a first attenuation compensation element coupled in series between the first parallel resistance-reactance circuit and RF ground;
   (d) a second parallel resistance-reactance circuit coupled to the second termination port; and
   (e) a second attenuation compensation element coupled in series between the second parallel resistance-reactance circuit and RF ground;
wherein the reactances in the parallel resistance-reactance circuits of the first circuit are capacitive and the attenuation compensation elements of the first circuit are inductive, and the reactances in the parallel resistance-reactance circuits of the second circuit are inductive and the attenuation compensation elements of the second circuit are capacitive.

31. A method for controlling phase and attenuation for an RF signal, including:
   (a) providing a hybrid coupler having an RF input port for receiving an RF signal, an RF output port for outputting the RF signal after modification of at least one of phase and attenuation, a first termination port, and a second termination port;
   (b) providing a first parallel resistance-reactance circuit coupled between the first termination port and RF ground, wherein the first resistance-reactance circuit includes a resistor connected directly between the first termination port and RF ground;
   (c) providing a second parallel resistance-reactance circuit coupled between the second termination port and RF ground, wherein the second resistance-reactance circuit includes a resistor connected directly between the second termination port and RF ground; and
   (d) modifying the RF signal with respect to at least one of phase and attenuation.

32. The method of claim 31, wherein at least one parallel resistance-reactance circuits is a parallel resistor-capacitor circuit.

33. The method of claim 32, further including providing an inductor coupled in parallel with at least one parallel resistor-capacitor circuit.

34. The method of claim 31, wherein at least one parallel resistance-reactance circuits is a parallel resistor-inductor circuit.

35. The method of claim 34, further including providing a capacitor coupled in parallel with at least one parallel resistor-inductor circuit.

36. The method of claim 31, wherein at least one parallel resistance-reactance circuit has a variable resistance.

37. The method of claim 31, wherein at least one parallel resistance-reactance circuit has a variable reactance.

38. The method of claim 37, wherein the variable reactance is a variable capacitance.

39. The method of claim 37, wherein the variable reactance is a variable inductance.

40. The method of claim 31, wherein at least one parallel resistance-reactance circuit has a variable resistance and a variable reactance.

41. The method of claim 31, wherein at least one parallel resistance-reactance circuit is a digitally tunable parallel resistance-reactance circuit.

42. The method of claim 31, wherein the hybrid coupler is a Lange coupler.

43. A method for controlling phase and attenuation for an RF signal, including:
(a) providing a hybrid coupler having an RF input port for receiving an RF signal, an RF output port for outputting the RF signal after modification of at least one of phase and attenuation, a first termination port, and a second termination port;
(b) providing a first parallel resistance-reactance circuit coupled to the first termination port;
(c) providing a first attenuation compensation element coupled in series between the first parallel resistance-reactance circuit and RF ground;
(d) providing a second parallel resistance-reactance circuit coupled to the second termination port;
(e) providing a second attenuation compensation element coupled in series between the second parallel resistance-reactance circuit and RF ground; and
(f) modifying the RF signal with respect to at least one of phase and attenuation.

44. The method of claim 43, wherein at least one of the first and second parallel resistance-reactance circuits is a parallel resistor-capacitor circuit.

45. The method of claim 44, further including providing an inductor coupled in parallel with at least one parallel resistor-capacitor circuit.

46. The method of claim 44, wherein at least one attenuation compensation element is an inductive element.

47. The method of claim 43, wherein at least one of the first and second parallel resistance-reactance circuits is a parallel resistor-inductor circuit.

48. The method of claim 47, further including providing a capacitor coupled in parallel with at least one parallel resistor-inductor circuit.

49. The method of claim 47, wherein at least one attenuation compensation element is a capacitive element.

50. The method of claim 43, wherein at least one parallel resistance-reactance circuit has a variable resistance.

51. The method of claim 43, wherein at least one parallel resistance-reactance circuit has a variable reactance.

52. The method of claim 51, wherein the variable reactance is a variable capacitance.

53. The method of claim 51, wherein the variable reactance is a variable inductance.

54. The method of claim 43, wherein at least one parallel resistance-reactance circuit has a variable resistance and a variable reactance.

55. The method of claim 43, wherein at least one parallel resistance-reactance circuit is a digitally tunable parallel resistance-reactance circuit.

56. The method of claim 43, wherein the hybrid coupler is a Lange coupler.

57. The method of claim 43, wherein at least one attenuation compensation element is a transmission line.

58. A method for controlling phase and attenuation for an RF signal, including:
(a) providing series-connected first and second circuits, each circuit including:
(i) a hybrid coupler having an RF input port, an RF output port, a first termination port, and a second termination port;
(ii) a first parallel resistance-reactance circuit coupled to the first termination port;
(iii) a first attenuation compensation element coupled in series between the first parallel resistance-reactance circuit and RF ground;
(iv) a second parallel resistance-reactance circuit coupled to the second termination port; and
(v) a second attenuation compensation element coupled in series between the second parallel resistance-reactance circuit and RF ground;
(b) configuring the reactances in the parallel resistance-reactance circuits of the first circuit as capacitances and the attenuation compensation elements of the first circuit as inductive elements;
(c) configuring the reactances in the parallel resistance-reactance circuits of the second circuit is inductances and the attenuation compensation elements of the second circuit as capacitive elements; and
(d) modifying the RF signal with respect to at least one of phase and attenuation.

59. A method for controlling phase and attenuation for an RF signal, including:
(a) providing a first hybrid coupler having a first RF input port for receiving an RF signal, a first RF output port for outputting the RF signal after modification of at least one of phase and attenuation, a first termination port, and a second termination port;
(b) coupling a first parallel resistance-reactance circuit between the first termination port and RF ground;
(c) coupling a second parallel resistance-reactance circuit between the second termination port and RF ground;
(d) providing a second hybrid coupler having a second RF input port coupled to the first RF output port of the first hybrid coupler, and a second RF output port for outputting the RF signal after modification of at least one of phase and attenuation, a third termination port, and a fourth termination port;
(e) coupling a third parallel resistance-reactance circuit between the third termination port and RF ground;
(f) coupling a fourth parallel resistance-reactance circuit coupled between the fourth termination port and RF ground; and
(g) modifying the RF signal with respect to at least one of phase and attenuation;
wherein the reactances in the parallel resistance-reactance circuits of one of the first or second hybrid coupler are capacitive, and the reactances in the parallel resistance-reactance circuits of the other of the first or second hybrid coupler are inductive, and wherein the first and second hybrid couplers have opposite frequency-dependent slopes for phase shift and attenuation.

* * * * *